US009543427B2

(12) United States Patent
Kudou et al.

(10) Patent No.: US 9,543,427 B2
(45) Date of Patent: Jan. 10, 2017

(54) SEMICONDUCTOR DEVICE AND METHOD FOR FABRICATING THE SAME

(71) Applicant: Panasonic Intellectual Property Management Co., Ltd., Osaka (JP)

(72) Inventors: Chiaki Kudou, Toyama (JP); Haruyuki Sorada, Toyama (JP); Tsuneichiro Sano, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/820,555

(22) Filed: Aug. 7, 2015

(65) Prior Publication Data

US 2016/0071971 A1    Mar. 10, 2016

(30) Foreign Application Priority Data

Sep. 4, 2014   (JP) .................................. 2014-180139

(51) Int. Cl.
| | | |
|---|---|---|
| *H01L 29/78* | (2006.01) | |
| *H01L 29/08* | (2006.01) | |
| *H01L 29/10* | (2006.01) | |
| *H01L 29/423* | (2006.01) | |
| *H01L 29/66* | (2006.01) | |

(Continued)

(52) U.S. Cl.
CPC ..... *H01L 29/7802* (2013.01); *H01L 21/32134* (2013.01); *H01L 21/32137* (2013.01); *H01L 29/0865* (2013.01); *H01L 29/1095* (2013.01); *H01L 29/42356* (2013.01); *H01L 29/42376* (2013.01); *H01L 29/66712* (2013.01); *H01L 21/02131* (2013.01); *H01L 21/02266* (2013.01);

(Continued)

(58) Field of Classification Search
CPC .................................................... H01L 29/7802
See application file for complete search history.

(56) References Cited

U.S. PATENT DOCUMENTS

| | | |
|---|---|---|
| 5,175,119 A | 12/1992 | Matsutani |
| 5,869,374 A | 2/1999 | Wu |

(Continued)

FOREIGN PATENT DOCUMENTS

| | | |
|---|---|---|
| JP | 54-143076 | 11/1979 |
| JP | 3-036736 | 2/1991 |

(Continued)

*Primary Examiner* — Peniel M Gumedzoe
*Assistant Examiner* — Christopher Johnson
(74) *Attorney, Agent, or Firm* — McDermott Will & Emery LLP

(57) ABSTRACT

A semiconductor device includes: semiconductor layer having an impurity region of a first conductivity type; a gate insulating layer, at least a part of the gate insulating layer positioned on the semiconductor layer; a gate electrode positioned on the gate insulating layer and having a first surface in contact with the part of the gate insulating film and a second surface opposite to the first surface; an interlayer insulating layer covering the gate electrode; and an electrode in contact with the impurity region. The gate electrode has a recess at a corner in contact with the second surface, in a cross section of the gate electrode perpendicular to a surface of the semiconductor layer. A cavity surrounded by the gate electrode and the interlayer insulating layer is positioned in a region including at least a part of the recess.

5 Claims, 10 Drawing Sheets

(51) Int. Cl.
*H01L 21/3213* (2006.01)
*H01L 21/02* (2006.01)

(52) U.S. Cl.
CPC .. *H01L 21/02274* (2013.01); *H01L 2924/0002* (2013.01)

(56) References Cited

U.S. PATENT DOCUMENTS

| | | | |
|---|---|---|---|
| 5,972,761 | A | 10/1999 | Wu |
| 6,331,478 | B1 | 12/2001 | Lee et al. |
| 2005/0173722 | A1 | 8/2005 | Tanaka |
| 2006/0046449 | A1 | 3/2006 | Liaw |
| 2013/0175548 | A1 | 7/2013 | Kudou |
| 2014/0042523 | A1* | 2/2014 | Yamagami ........ H01L 29/41766 257/328 |
| 2015/0255561 | A1* | 9/2015 | Cai ................ H01L 29/78 257/411 |
| 2015/0263151 | A1* | 9/2015 | Kawashiri ........ H01L 29/42304 257/139 |

FOREIGN PATENT DOCUMENTS

| | | |
|---|---|---|
| JP | 3-268434 | 11/1991 |
| JP | 4-196439 | 7/1992 |
| JP | 4-317339 | 11/1992 |
| JP | 5-095113 | 4/1993 |
| JP | 5-198589 | 8/1993 |
| JP | 2001-028436 | 1/2001 |
| JP | 2001-148356 | 5/2001 |
| JP | 2004-095888 | 3/2004 |
| JP | 2008-198762 | 8/2008 |
| JP | 2012-151400 | 8/2012 |
| WO | 2013/076890 | 5/2013 |

\* cited by examiner

PRIOR ART

SEMICONDUCTOR DEVICE AND METHOD FOR FABRICATING THE SAME

BACKGROUND

1. Technical Field

The present disclosure relates to semiconductor devices and methods for fabricating the same.

2. Description of the Related Art

Wide-bandgap semiconductors are applied to various semiconductor devices such as power devices, devices with enhanced environmental resistance, high-temperature operating devices, and high-frequency devices. Among such devices, attention has been directed to applications to power devices such as switching devices and rectifying devices.

Among wide-bandgap semiconductors, silicon carbide (SiC) is a semiconductor material that enables relatively easy fabrication of a substrate and also enables formation of a silicon dioxide ($SiO_2$) layer, which is a high-quality gate insulating layer, by thermal oxidation. In view of this, power devices using SiC have been actively developed (see, for example, Japanese Unexamined Patent Application Publication No. 2012-151400).

Examples of a switching device for a power device using SiC include a metal insulator semiconductor field effect transistor (hereinafter referred to as a "MISFET") and a metal semiconductor field effect transistor (hereinafter referred to as a "MESFET").

The electrical breakdown field and thermal conductivity of SiC are higher than those of Si. Thus, a SiC power device using SiC can increase the breakdown voltage and reduce a loss more easily than a Si power device. In the case of obtaining the same performance as the Si power device, the SIC power device can significantly reduce the device area and thickness, as compared to the Si power device.

As the device area and thickness decrease, the parasitic capacitance of a gate electrode with respect to a substrate decreases. SiC has a higher electron saturation velocity than that of Si. By utilizing these advantages, the SiC power device performs a switching operation at a much higher speed than the Si power device.

To obtain a SiC power device that can operate at high speed while taking advantages of the above-described features, Japanese Unexamined Patent Application Publication No. 2012-151400 describes a SiC power device including a gate insulating layer with a double-layer structure of an oxidized layer doped with phosphorus and an insulating layer for reducing diffusion of phosphorus. Japanese Unexamined Patent Application Publication No. 2012-151400 describes that this structure reduces the interface state density at the interface between a silicon carbide semiconductor layer and the insulating layer and, thereby, increases on mobility.

SUMMARY

In one general aspect, the techniques disclosed here feature a semiconductor device including: a semiconductor layer having an impurity region of a first conductivity type; a gate insulating layer, at least a part of the gate insulating layer positioned on the semiconductor layer; a gate electrode positioned on the gate insulating layer and having a first surface in contact with the part of the gate insulating film and a second surface opposite to the first surface; an interlayer insulating layer covering the gate electrode; an electrode in contact with the impurity region; and a wiring positioned on the interlayer insulating layer and electrically connected to the electrode, wherein a part of the interlayer insulating layer is positioned between the gate electrode and the electrode, the gate electrode has a recess positioned at a corner in contact with the second surface of the gate electrode, in a cross section of the gate electrode perpendicular to a surface of the semiconductor layer, a cavity surrounded by the gate electrode and the interlayer insulating layer including the part of the interlayer insulating layer is positioned in a region including at least a part of the recess, and in the cross section of the gate electrode, a distance between an edge of the cavity in contact with the part of the interlayer insulating layer and a virtual center axis of the gate electrode is larger than or equal to a distance between an edge of the gate electrode at the first surface of the gate electrode and the virtual center axis of the gate electrode.

The semiconductor device can reduce a capacitance between a gate electrode and a source electrode and a capacitance between the gate electrode and a wiring with a reduced increase in gate resistance.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

An inventor of the present disclosure examined a structure for obtaining more excellent high-frequency operating characteristics in a typical semiconductor device using SiC. First, a cross-sectional structure of a typical vertical MISFET with a planar structure, which is a switching device using SiC, will be described with reference to the drawings. The vertical MISFET generally includes a plurality of unit cells that are two-dimensionally arranged. Each of the unit cells includes a gate electrode provided on a principal surface of a substrate.

Figure 14:
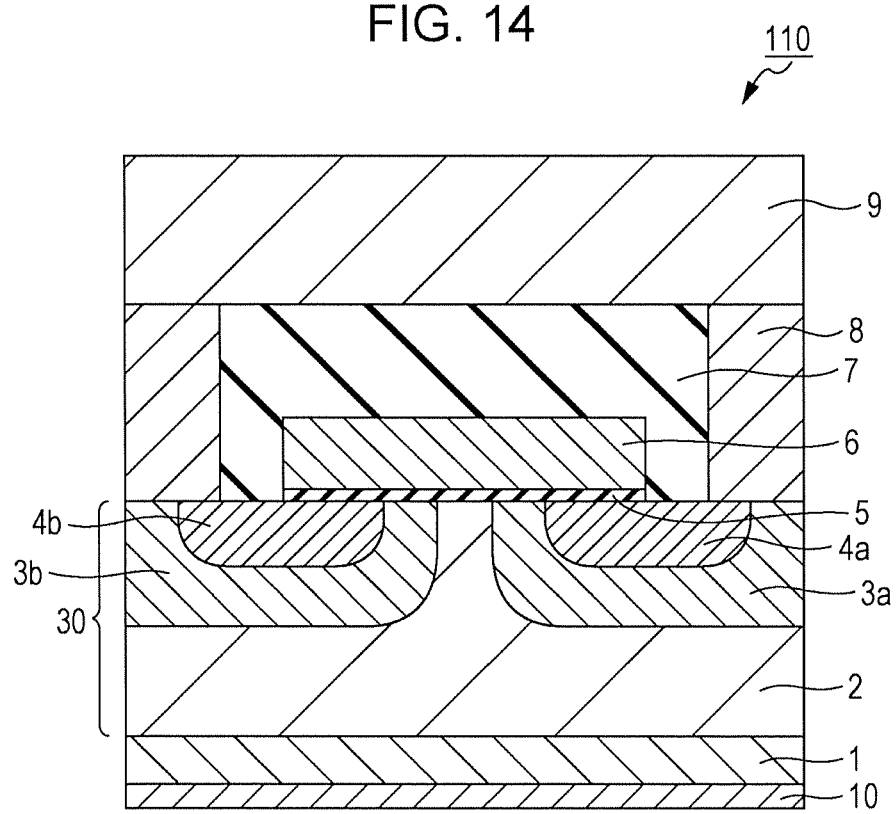
FIG. 14 is a cross-sectional view schematically illustrating a typical MISFET.

FIG. 14 is a cross-sectional view illustrating a configuration of a typical vertical MISFET with a planar structure and shows a unit cell 110. The vertical MISFET illustrated in FIG. 14 includes a substrate 1 of silicon carbide and a semiconductor layer 30 on the principal surface of the substrate 1. The semiconductor layer 30 includes an n-type drift region 2 on the principal surface of the substrate 1 and p-type body regions 3a and 3b on the drift region 2. The semiconductor layer 30 also includes source regions 4a and 4b positioned in respective parts of the body regions 3a and 3b. A gate insulating layer 5 covers a part of the drift layer 2 exposed from the body regions 3a and 3b and the body regions 3a and 3b, and overlaps parts of the source regions 4a and 4b. A gate electrode 6 is disposed on top of the gate insulating layer 5. The gate electrode 6 is covered with an interlayer insulating layer 7. Source electrodes 8 are disposed on the semiconductor layer 30 and are in contact with the source regions 4a and 4b. A wiring 9 is disposed on top of the interlayer insulating layer 7 and connects the source electrodes 8. A drain electrode 10 is disposed on the back surface of the substrate 1.

Figure 15:
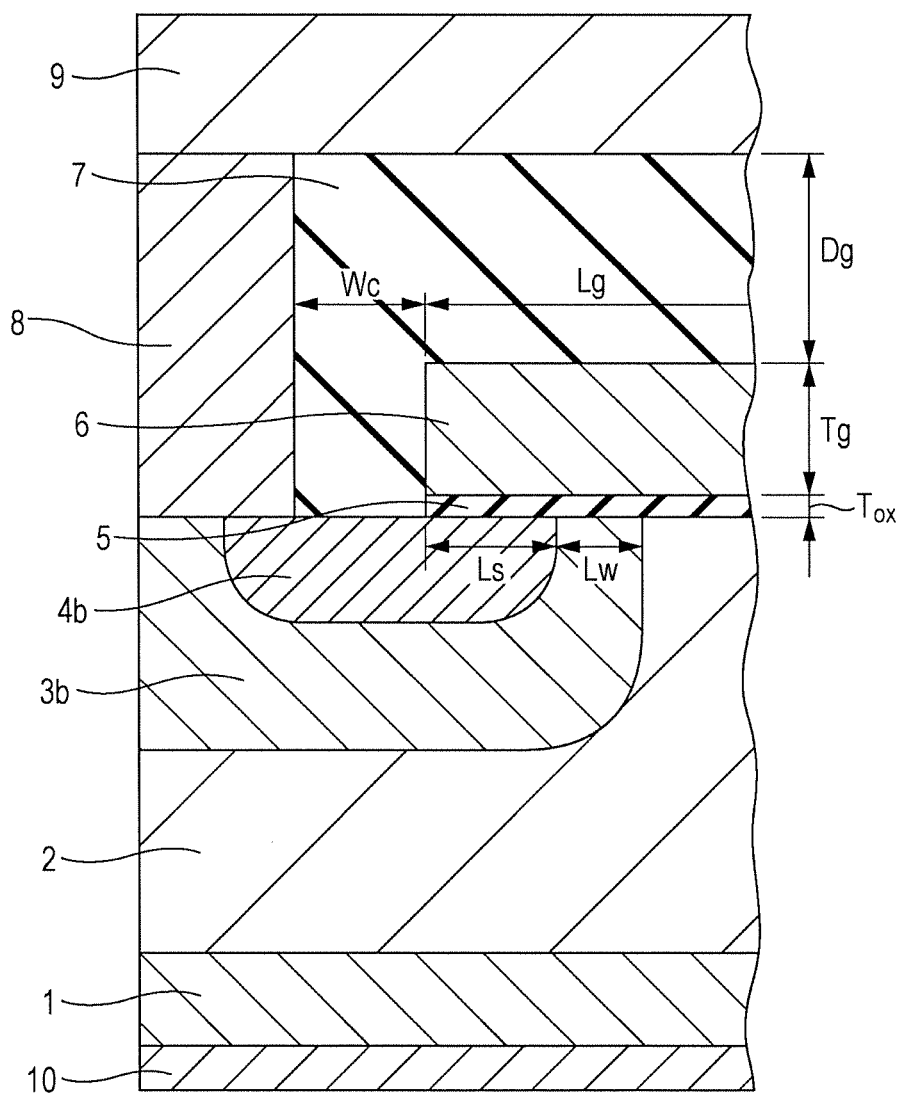
FIG. 15 is an enlarged cross-sectional view schematically illustrating a typical MISFET.

Application of the structure described in Japanese Unexamined Patent Application Publication No. 2012-151400 to the semiconductor device with the above-described configuration can reduce the interface state density at the interface between the gate insulating layer and the SiC layer. However, the structure described in Japanese Unexamined Patent Application Publication No. 2012-151400 cannot improve high-frequency operating characteristics depending on parasitic capacitances between the gate electrode and the source electrode and between the gate electrode and the wiring. The parasitic capacitances of the gate electrode include a capacitance (Cgs) between gate and source and a capacitance (Cgd) between gate and drain. These components will be described with reference to FIG. 15, which is an enlarged view of FIG. 14.

The capacitance Cgs is a sum of a capacitance Cgs1 between the gate electrode 6 and the source region 4b, a capacitance Cgs2 between the gate electrode 6 and the body region 3b, a capacitance Cgs3 between the gate electrode 6 and the source electrodes 8, and a capacitance Cgs4 between the gate electrode 6 and the wiring 9.

On the other hand, the capacitance Cgd is a capacitance between the gate electrode 6 and the drift region 2.

First, the capacitance Cgs1 is obtained from a thickness $T_{ox}$ of the gate insulating layer 5 and a length Ls of a region where the gate electrode 6 and the source region 4b overlap each other, and calculated as:

$$Cgs1 = \in0 \times \in1 \times (Ls/T_{ox})$$

where $\in0$ is a permittivity of vacuum and $\in1$ is a dielectric constant of the gate insulating layer.

Similarly, the capacitance Cgs2 is obtained from the thickness $T_{ox}$ of the gate insulating layer 5 and a length Lw of a region where the gate electrode 6 and the body region 3b overlap each other, and calculated as:

$$Cgs2 = \in0 \times \in g \times (Lw/T_{ox}).$$

On the other hand, the capacitance Cgs3 is obtained from a distance Wc between the gate electrode 6 and the source electrodes 8, a height Tg of the gate electrode 6, a dielectric constant $\in2$ of the interlayer insulating layer 7, and the capacitance Cgs4 is obtained from a distance Dg between the gate electrode 6 and the wiring 9, a width Lg of the gate electrode 6, and a dielectric constant $\in2$ of the interlayer insulating layer 7. The capacitance Cgs3 and the capacitance Cgs4 are respectively calculated as:

$$Cgs3 = \in0 \times \in2 \times (Tg/Wc)$$

$$Cgs4 = \in0 \times \in2 \times (Lg/Dg).$$

For example, suppose the gate insulating layer 5 and the interlayer insulating layer 7 are silicon oxidized layers, $\in1$ and $\in2$ are 3.9, $T_{ox}$=70 nm, Ls=500 nm, Lw=500 nm, Wc=700 nm, Tg=500 nm, Dg=1000 nm, and Lg=1500 nm, then the proportions of Cgs3 and Cgs4 in Cgs are 4% and 9%, respectively, and the sum of the proportions of Cgs3 and Cgs4 is 13%. The proportions of Cgs3 and Cgs4 in the sum of Cgs and Cgd, which is the total parasitic capacitance, are 3% and 6%, respectively, and the sum of the proportions of Cgs3 and Cgs4 is 9%.

To reduce this value, reduction of the height Tg of the gate electrode 6 might be effective, for example, from the foregoing equations. In this case, however, the gate resistance increases so that a delay speed calculated as the product of the gate resistance and gate capacitance does not improve. An increase in the thickness Dg of the interlayer insulating layer 7 might also be effective. However, this case has drawbacks such as a prolonged time of the process of forming the interlayer insulating layer 7 and difficulty in fabrication.

Such degradation of high-frequency operating characteristics due to parasitic capacitances between the gate electrode and the source electrode and between the gate electrode and the wiring is not limited to silicon carbide MISFETs. Semiconductor devices using semiconductors (e.g., wide-bandgap semiconductors such as GaN, AlN, and diamond, and Si semiconductor) except silicon carbide have similar problems. In addition to power devices, CMOS devices using Si, for example, also have similar problems.

In view of such problems, the inventor of the present disclosure arrived at a semiconductor device with a new configuration. An aspect of a semiconductor device of the present disclosure is as follows.

A semiconductor device in an aspect of the present disclosure includes: a semiconductor layer having an impurity region of a first conductivity type; a gate insulating layer, at least a part of the gate insulating layer positioned on the semiconductor layer; a gate electrode positioned on the gate insulating layer and having a first surface in contact with the part of the gate insulating film and a second surface opposite to the first surface; an interlayer insulating layer covering the gate electrode; an electrode in contact with the impurity region; and a wiring positioned on the interlayer insulating layer and electrically connected to the electrode, wherein a part of the interlayer insulating layer is positioned between the gate electrode and the electrode, the gate electrode has a recess positioned at a corner in contact with the second surface of the gate electrode, in a cross section of the gate electrode perpendicular to a surface of the semiconductor layer, a cavity surrounded by the gate electrode and the interlayer insulating layer including the part of the interlayer insulating layer is positioned in a region including at least a part of the recess, and in the cross section of the gate electrode, a distance between an edge of the cavity in contact with the part of the interlayer insulating layer and a virtual center axis of the gate electrode is larger than or equal to a distance between an edge of the gate electrode at the first surface of the gate electrode and the virtual center axis of the gate electrode. With this configuration, the cavity having a dielectric constant smaller than that of the insulating layer such as an oxide film is positioned in an edge of an upper portion of the gate electrode. Thus, the electrical distance between the gate electrode and the electrode adjacent to the upper edge of the gate electrode and the electrical distance between the gate electrode and the wiring increase, thereby reducing parasitic capacitances of the gate electrode. In addition, the parasitic capacitances of the gate electrode can be reduced, as compared to a configuration in which in a direction parallel to the surface of the semiconductor layer in the cross-section of the semiconductor layer, the distance between the edge of the cavity in contact with part of the interlayer insulating layer positioned between the cavity and the electrode and the virtual center axis of the gate electrode is smaller than the distance between the edge of the gate electrode at the first surface of the gate electrode and the virtual center axis of the gate electrode.

The semiconductor device may further include an insulating mask layer positioned on the gate electrode. The presence of the insulating mask layer enables the recess to be formed in an edge of an upper portion of the gate electrode by adding a simple process step.

The cavity may not be in contact with the gate insulating layer. With this configuration, a decrease in the area of the gate electrode facing the substrate with the gate insulating layer interposed therebetween can be reduced, and parasitic capacitances of the gate electrode can be reduced without degradation of characteristics of the gate electrode.

The semiconductor layer may have a drift region of the first conductivity type and a body region of a second conductivity type positioned above the drift region, and the impurity region may be in contact with the body region. With this configuration, a MISFET with excellent high-frequency characteristics and reduced parasitic capacitances of the gate electrode can be obtained.

In the cross section of the gate electrode, a length of a region where the gate electrode overlaps the impurity region may be larger than a width of the cavity parallel to the surface of the semiconductor layer. With this configuration, since the cavity is not positioned in a portion of the gate electrode above a region serving as a channel, a sufficient thickness of the gate electrode in this region can be obtained, and the gate resistance can be reduced.

A method for fabricating a semiconductor device in another aspect of the present disclosure includes: providing a semiconductor layer having an impurity region of a first conductivity type; forming a gate insulating layer on the semiconductor layer; forming a conductive layer on the gate insulating layer; forming an insulating mask layer on the conductive layer; the insulating mask layer having a size corresponding to a gate electrode; performing isotropic etching using the insulating mask layer as a mask, thereby removing at least a part of a first portion of the conductive layer not covered with the insulating mask layer and at least a part of a second portion of the conductive layer covered with the insulating mask layer; performing anisotropic etching using the insulating mask layer as a mask, thereby removing the other part of the first portion of the conductive layer and forming the gate electrode having a recess in the part of the second portion of the conductive layer; forming an interlayer insulating layer on the insulating mask layer and on the semiconductor layer, thereby forming a cavity surrounded by the insulating mask layer, the gate electrode, and the interlayer insulating layer and including at least a part of the recess; forming a contact hole connected to the impurity region; forming an electrode in the contact hole; and forming a wiring on the interlayer insulating layer and the electrode, wherein a part of the interlayer insulating layer is positioned between the gate electrode and the electrode, and in a cross section of the gate electrode perpendicular to a surface of the semiconductor layer, a distance between an edge of the cavity in contact with the part of the interlayer insulating layer and a virtual center axis of the gate electrode is larger than or equal to a distance between an edge of the gate electrode in contact with the gate insulating layer and the virtual center axis of the gate electrode. With this method, the cavity that can reduce parasitic capacitances of the gate electrode at the edge can be formed in the upper portion of the gate electrode by adding the step of forming the insulating mask layer and the step of etching the conductive layer to a typical method for fabricating a semiconductor device and changing a technique of forming an interlayer insulating layer of the typical method.

The interlayer insulating layer may be formed by physical vapor deposition. The use of physical vapor deposition enables formation of the interlayer insulating layer having the cavity below a canopy of the insulating mask layer.

The interlayer insulating layer may be formed by high-density plasma chemical vapor deposition and physical vapor deposition. The use of these two techniques enables formation of the interlayer insulating layer having the cavity within a practical time.

A thickness of the at least part of the first portion of the conductive layer and the part of the second portion of the conductive layer removed by the isotropic etching may be smaller than a thickness of the conductive layer. Then, contact of the cavity with the gate insulating layer can be reduced.

The semiconductor layer may have a drift region of a first conductivity type, and a body region of a second conductivity type positioned above the drift region and being in contact with the impurity region, and in the cross section of the gate electrode, a length of a region where the gate electrode overlaps the impurity region may be larger than a width of the cavity parallel to the surface of the semiconductor layer. Then, since the cavity is not positioned in a portion of the gate electrode positioned above a region serving as a channel, the thickness of the gate electrode in this region can be sufficiently obtained, and the gate resistance can be reduced.

An embodiment of the present disclosure will be described with reference to the drawings. A semiconductor device according to this embodiment is a silicon carbide MISFET with a planar structure. This embodiment, however, is not limited to the silicon carbide MISFET, and is applicable to other silicon carbide semiconductor devices such as a silicon carbide MESFET and semiconductor devices using semiconductors, such as silicon, except silicon carbide. This embodiment is not limited to the planar structure, and is applicable to a semiconductor device with a trench structure.

Figure 1A:
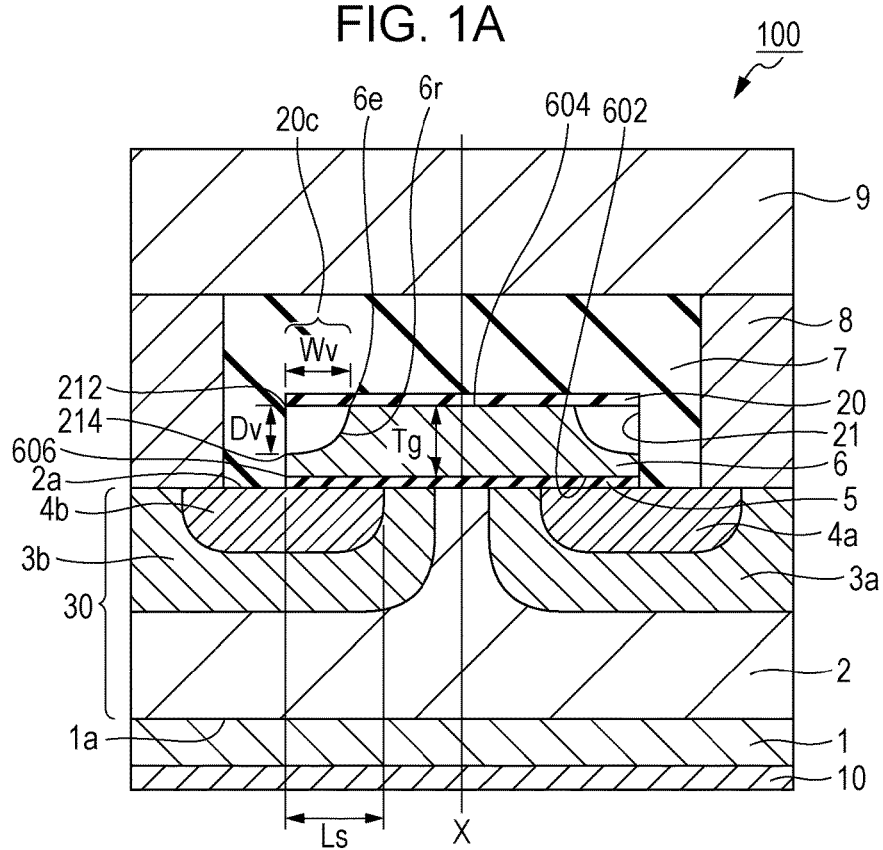
FIG. 1A is a cross-sectional view schematically illustrating a semiconductor device according an embodiment.
Figure 2:
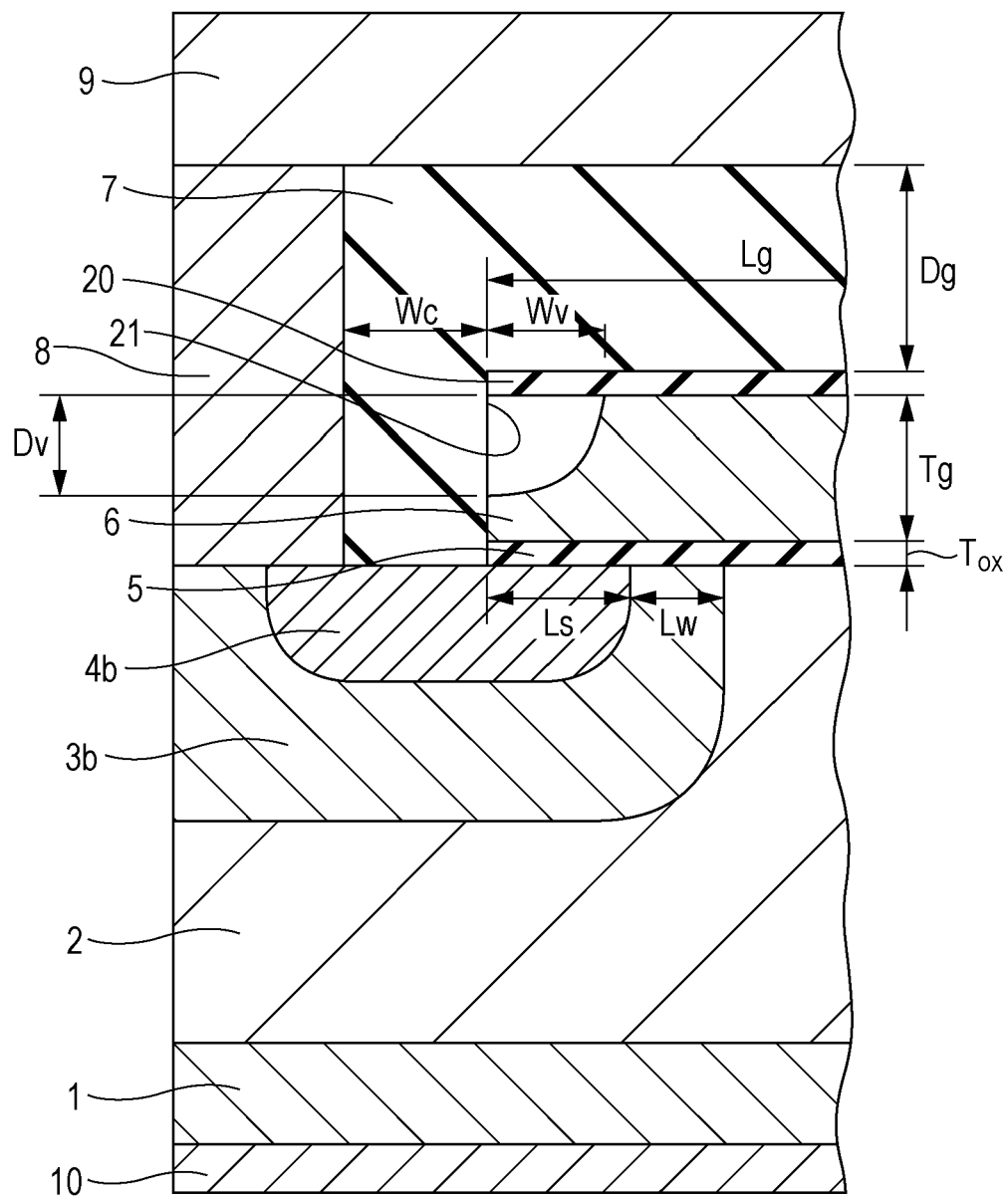
FIG. 2 is an enlarged cross-sectional view schematically illustrating an edge of the gate electrode in the semiconductor device of the embodiment.

The semiconductor device of this embodiment includes a plurality of unit cells that are two-dimensionally arranged. FIG. 1A is a cross-sectional view of a unit cell 100 in the semiconductor device. FIG. 2 is an enlarged partial view of FIG. 1A.

The unit cell 100 of the semiconductor device includes a substrate 1 including silicon carbide and a semiconductor layer 30 of silicon carbide disposed on a principal surface 1a of the substrate 1. The semiconductor layer 30 includes a drift region 2 of a first conductivity type disposed on the principal surface 1a of the substrate 1 and body regions 3a and 3b of a second conductivity type disposed on the drift region 2. In the example of this embodiment, the first conductivity type is an n-type, and the second conductivity type is a p-type. Source regions 4a and 4b corresponding to an impurity region of the first conductivity type are disposed in parts of surface regions of the body regions 3a and 3b, respectively. In the illustrated example, the source regions 4a and 4b are surrounded by the body regions 3a and 3b, respectively, in the surface of the semiconductor layer 30.

The unit cell 100 includes a gate insulating layer 5 and a gate electrode 6 disposed on the gate insulating layer 5, toward the principal surface 1a of the substrate 1 and on the surface 2a of the semiconductor layer 30. In this embodiment, the gate electrode 6 is positioned to the surface 2a of the semiconductor layer 30 with the gate insulating layer 5 sandwiched therebetween. The gate electrode 6 and the gate insulating layer 5 cover part of the drift layer 2 exposed between the body regions 3a and 3b, and overlap parts of the body regions 3a and 3b and parts of the source regions 4a and 4b. The gate electrode 6 is, for example, a polysilicon layer having a concentration of $1 \times 10^{20}$ m$^{-3}$ and containing phosphorus.

Figure 1B:
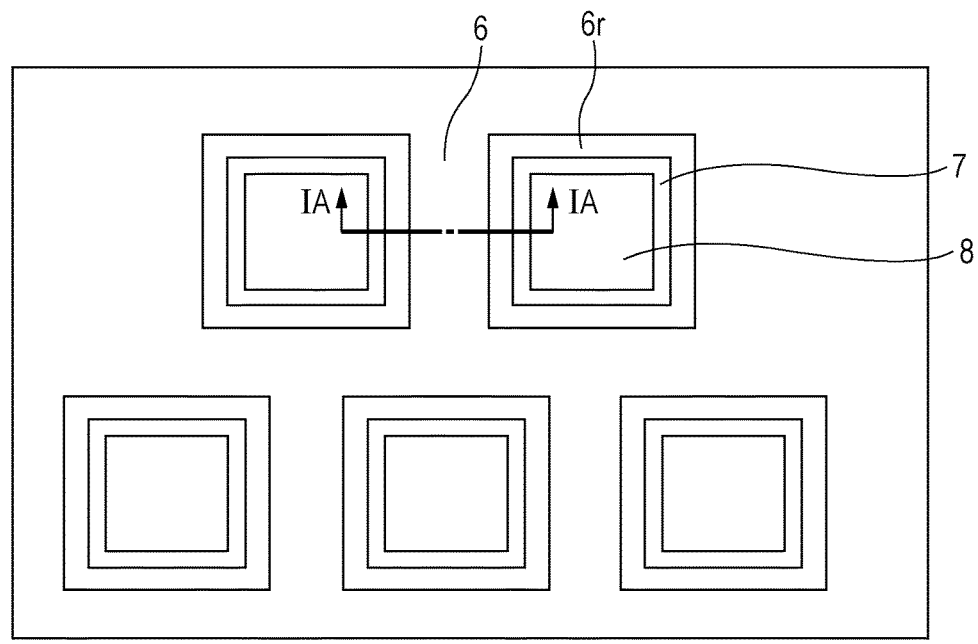
FIG. 1B is a plan view showing the shape of a gate electrode in the semiconductor device of the embodiment.

As illustrated in FIG. 1A, the gate electrode 6 has a first surface 602 in contact with the gate insulating layer and a second surface 604 opposite to the first surface 602. The gate electrode 6 has a recess 6r in an edge of an upper portion of the gate electrode 6 in a cross section perpendicular to the surface 2a of the semiconductor layer 30. In other words, in the cross section perpendicular to the surface 2a of the semiconductor layer 30, the gate electrode 6 has the recess 6r at a corner in contact with the second surface 604 of the gate electrode 6. An insulating mask layer 20 is positioned on the gate electrode 6. The insulating mask layer 20 projects over the recess 6r of the gate electrode 6 and has a canopy 20c covering the recess 6r. The gate electrode 6 is connected to a gate electrode 6 of an adjacent unit cell 100 and forms one layer. FIG. 1B illustrates a shape of the gate electrode 6 perpendicularly seen with respect to the principal surface 1a of the substrate 1. The cross section taken along line IA-IA in FIG. 1B is shown in FIG. 1A.

The unit cell 100 is positioned to the principal surface 1a of the substrate 1, and includes the interlayer insulating layer 7 covering the gate insulating layer 5, the gate electrode 6, and the insulating mask layer 20 and the source electrodes 8 in contact with the source regions 4a and 4b.

The interlayer insulating layer 7 is not present in the recess 6r of the gate electrode 6, and the recess 6r is formed as a cavity 21. That is, the cavity 21 is surrounded by the gate electrode 6, the interlayer insulating layer 7, and the insulating mask layer 20. The cavity 21 has a thickness Dv smaller than a thickness Tg of the gate electrode 6. The cavity 21 may have a width Wv smaller than a length Ls of a region where the gate electrode 6 and the source region 4a or 4b overlap each other. In other words, an edge 6e of the cavity 21 in contact with the second surface 604 of the gate electrode 6 is positioned above the source region 4b. As illustrated in FIG. 1A, in this embodiment, the distance between an edge 212 or an edge 214 of the cavity 21 in contact with part of the interlayer insulating layer 7 positioned between the cavity 21 and the source electrodes 8 and a virtual center axis X of the gate electrode 6 is equal to the distance between an edge 606 of the gate electrode 6 at the first surface 602 of the gate electrode 6 and the virtual center axis X of the gate electrode 6.

The cavity 21 is a region not filled with a solid such as the interlayer insulating layer 7. The cavity 21 may be filled with a gas such as nitrogen or argon as an atmosphere in fabrication of the semiconductor device or may be filled with air. The pressure in the cavity 21 may be approximately equal to an atmospheric pressure or may be lower than atmospheric pressure.

At the surface 2a of the semiconductor layer 30, the source electrodes 8 are in contact with, and electrically connected to, the source regions 4a and 4b and the body regions 3a and 3b. The source electrodes 8 are adjacent to the gate electrode 6 with parts of the interlayer insulating layer 7 sandwiched therebetween.

A wiring 9 is disposed on top of the interlayer insulating layer 7 and connects the source electrodes 8. A drain electrode 10 is disposed on the back surface of the substrate 1.

As illustrated in FIG. 1A, in the semiconductor device of this embodiment, the cavity 21 is formed in an edge of an upper portion of the gate electrode 6. The cavity 21 has a dielectric constant of about 1 (one), and about one fourth of about 3.9, which is the dielectric constant of the insulating layer, e.g., a thermal oxidation layer. That is, the electrical thickness of the cavity is about 4 times as large as that of the thermal oxidation layer. Thus, the presence of the cavity in part of the insulating layer can reduce the electric field intensity between the gate electrode 6 and the semiconductor layer 30 to about one fourth. Accordingly, the presence of the cavity in part of the insulating layer can reduce parasitic capacitances of the gate electrode 6.

The parasitic capacitances of the gate electrode 6 include a capacitance Cgs between gate and source and a capacitance Cgd between gate and drain. These components will be described with reference to FIG. 2, which is an enlarged view of FIG. 1A.

As described above, the gate-source capacitance Cgs is a sum of a capacitance Cgs1 between the gate electrode 6 and the source region 4b, a capacitance Cgs2 between the gate electrode 6 and the body region 3b, a capacitance Cgs3 between the gate electrode 6 and the source electrodes 8, and a capacitance Cgs4 between the gate electrode 6 and the wiring 9.

On the other hand, the gate-drain capacitance Cgd is a capacitance between the gate electrode 6 and the drift region 2.

First, the capacitance Cgs1 is obtained from a thickness $T_{ox}$ of the gate insulating layer 5, a length Ls of a region where the gate electrode 6 and the source region 4b overlap each other, and calculated as:

$$Cgs1 = \in 0 \times \in 1 \times (Ls/T_{ox})$$

where $\in 0$ is a permittivity of vacuum and $\in 1$ is a dielectric constant of the gate insulating layer 5.

Similarly, the capacitance Cgs2 is obtained from the thickness $T_{ox}$ of the gate insulating layer 5 and a length Lw of a region where the gate electrode 6 and the body region 3b overlap each other, and calculated as:

$$Cgs2 = \epsilon_0 \times \epsilon_1 \times (Lw/T_{ox})$$

On the other hand, the capacitance Cgs3 is divided into a capacitance Cgs5 between a lower portion of the gate electrode 6, i.e., a portion not including the cavity 21, and an adjacent one of the source electrodes 8 and a capacitance Cgs6 between an upper portion of the gate electrode 6, i.e., a portion including the cavity 21 and an adjacent one of the source electrodes 8. The capacitance Cgs5 is calculated by subtracting a depth Dv of the cavity 21 from a distance Wc between the gate electrode 6 and the source electrodes 8 and a height Tg of the gate electrode 6. The capacitance Cgs6 is represented as a series of a capacitance Cgs6a corresponding to a region from one of the source electrodes 8 to an edge 214 of a lower portion of the gate electrode 6 close to the source electrode 8 and a capacitance Cgs6b corresponding to the cavity 21.

Similarly, the capacitance Cgs4 is divided into a capacitance Cgs7 between a center portion of the gate electrode 6, i.e., a portion not including the cavity 21, and the wiring 9 and a capacitance Cgs8 between an edge of the gate electrode 6, i.e., a portion including the cavity 21, and the wiring 9. The capacitance Cgs7 is calculated by subtracting the width Wv of the cavity 21 from a distance Dg between the gate electrode 6 and the wiring 9 and the width Lg of the gate electrode 6. The capacitance Cgs8 is represented as a series of a capacitance Cgs8a corresponding to a region from the wiring 9 to an upper portion of the gate electrode 6 and a capacitance Cgs8b corresponding to the cavity 21.

Thus, the following relations are obtained.

$$Cgs3 = Cgs5 + Cgs6$$

$$Cgs6 = (Cgs6a \times Cgs6b)/(Cgs6a + Cgs6b)$$

$$Cgs5 = \epsilon_0 \times \epsilon_2 \times ((Tg-Dv)/Wc)$$

$$Cgs6a = \epsilon_0 \times \epsilon_2 \times (Dv/Wc)$$

$$Cgs6b = \epsilon_0 \times \epsilon_1 \times (Dv/Wv)$$

$$Cgs4 = Cgs7 + Cgs8$$

$$Cgs8 = (Cgs8a \times Cgs8b)/(Cgs8a + Cgs8b)$$

$$Cgs7 = \epsilon_0 \times \epsilon_2 \times ((Lg-Wv)/Dg)$$

$$Cgs8a = \epsilon_0 \times \epsilon_2 \times (Wv/Wc)$$

$$Cgs8b = \epsilon_0 \times \epsilon_1 \times (Wv/Dv)$$

For example, suppose the gate insulating layer 5 and the interlayer insulating layer 7 are silicon oxidized layers, $\epsilon_1$ and $\epsilon_2$ are 3.9, $T_{ox}$=70 nm, Ls=500 nm, Lw=500 nm, Wc=700 nm, Tg=500 nm, Dg=1000 nm, Lg=1500 nm, Dv=300 nm, and W_ga=300 nm, then the proportions of Cgs3 and Cgs4 in Cgs are 3% and 8%, respectively, and the sum of the proportions of Cgs3 and Cgs4 is 11%. The proportions of Cgs3 and Cgs4 in the sum of Cgs and Cgd, which is the total parasitic capacitance, are 2% and 6%, respectively, and the sum of the proportions of Cgs3 and Cgs4 is 8%.

In the semiconductor device of this embodiment, Cgs decreases by 2.6% and the sum of Cgs and Cgd decreases by 1.8%, as compared to the typical semiconductor device described above.

As illustrated in FIG. 1A, the length of the region where the gate electrode 6 and the source region 4a or 4b overlap each other is larger than the width Wv of the cavity 21. Thus, the cavity 21 is not positioned above the region where the gate electrode 6 and the body region 3a or 3b overlap each other, i.e., the region serving as a channel. Thus, the gate electrode 6 in this region has a thickness Tg substantially equal to that of the typical semiconductor device, and thus, the resistance of the gate electrode can be kept low. That is, in the semiconductor device of this embodiment, the gate capacitance can be reduced without degradation of characteristics regarding the gate electrode near the channel, as compared to the typical semiconductor device.

In addition, as described later, the cavity 21 can be formed only by adding steps of formation of the insulating mask layer 20 and wet etching to typical fabrication process steps for fabricating a semiconductor device. Thus, it is possible to reduce a significant increase in the number of fabrication steps and tact time.

In the example of this embodiment, the cavity 21 is not positioned above the region where the gate electrode 6 and the body region 3a or 3b overlap each other. However, the cavity 21 may extend from above the source region 4a or 4b to above the body region 3a or 3b. That is, the width Wv of the cavity 21 may be larger than the length Ls of the region where the gate electrode 6 and the source region 4a or 4b overlap each other.

An example method for fabricating a semiconductor device according to this embodiment will be described with reference to the drawings.

Figure 3:
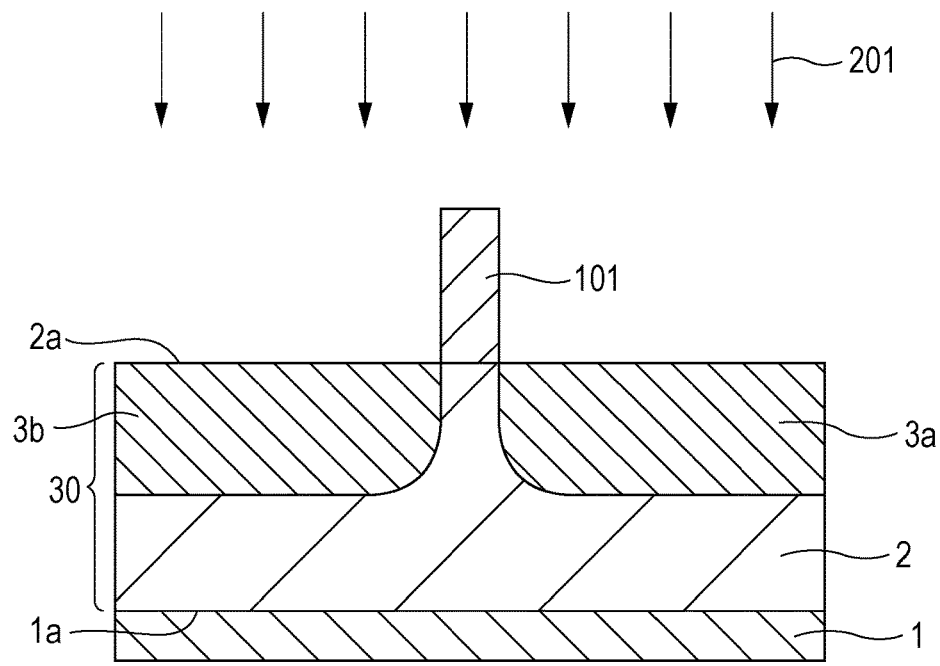
FIG. 3 is a cross-sectional view schematically showing a method for fabricating a semiconductor device according to the embodiment.

FIGS. 3 to 10 are cross-sectional views showing process steps of fabricating a semiconductor device according to this embodiment, First, as illustrated in FIG. 3, silicon carbide, for example, is deposited by epitaxial growth over a principal surface 1a of a substrate 1, thereby forming an n-type semiconductor layer 30 of silicon carbide, for example. Then, a mask layer 101 and a photoresist (not shown) are formed, and the photoresist is patterned by lithography. Using the photoresist as a mask, the mask layer 101 is processed by dry etching, and then, the photoresist is removed. Using the processed mask layer 101 as a mask, aluminium ions, for example, are implanted as a p-type impurity 201, for example, thereby forming p-type body regions 3a and 3b in a surface region of a semiconductor layer 30. In this manner, an n-type drift region 2 is formed in part of the semiconductor layer 30 except the body regions 3a and 3b. The body regions 3a and 3b are positioned above the drift region 2. The body regions 3a and 3b have island shapes, and thus, part of the drift region 2 is exposed from a surface 2a of the semiconductor layer 30 between the body region 3a and the body region 3b.

The substrate 1 may be a low-resistance n-type SiC substrate containing nitrogen in a concentration of $3 \times 10^{18}$ cm$^{-3}$, for example. The substrate 1 may also be a 4H—SiC substrate whose principal surface is a (0001) silicon plane, for example. The substrate 1 may also be a 4H—SiC substrate whose principal surface is at an off angle of about 8 degrees from a (0001) plane to a [11_20] direction. The semiconductor layer 30 is doped with, for example, nitrogen in a concentration of $8 \times 10^{15}$ cm$^{-3}$. The semiconductor layer 30 has a thickness of, for example, 12 μm. The thickness and concentration of the semiconductor layer 30 are determined based on a desired breakdown voltage of the semiconductor device, and are not limited to those described in the above example.

The body regions 3a and 3b are doped with, for example, aluminium in a concentration of $2 \times 10^{15}$ cm$-3$. The thickness of the body regions 3a and 3b is, for example, about 1 μm.

Figure 4:
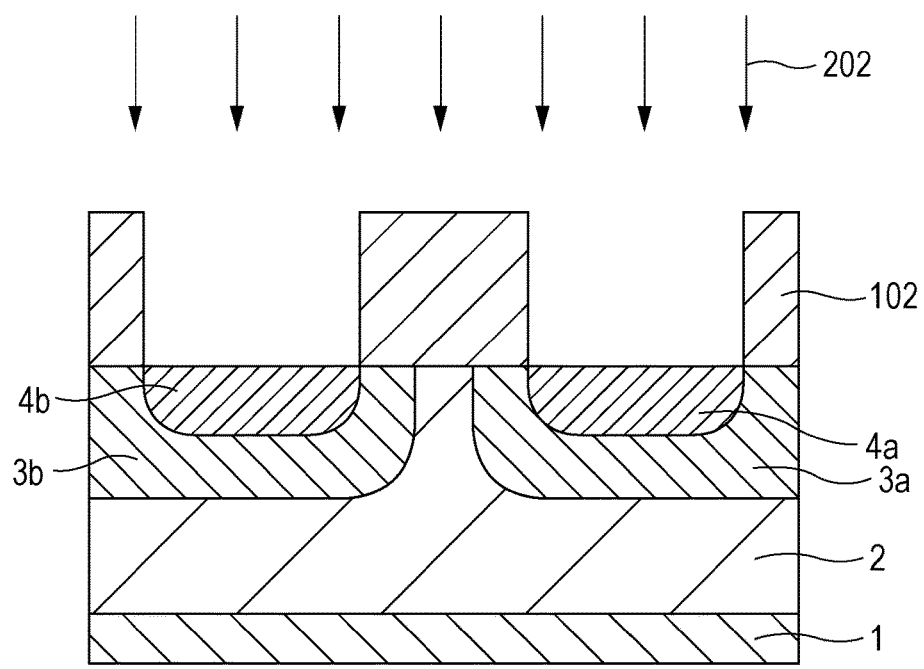
FIG. 4 is a cross-sectional view schematically showing the method for fabricating a semiconductor device of the embodiment.

Thereafter, as illustrated in FIG. 4, the mask layer 101 is removed, and then, a mask layer 102 is formed by a process step similar to that shown in FIG. 3. Then, the body regions 3a and 3b are doped with, for example, nitrogen ions as an n-type impurity 202, for example, thereby forming source regions 4a and 4b. Here, the acceleration energy is 100 keV, and the dosage is $5 \times 10^{15}$ cm$^{-2}$, for example. After the mask layer 102 has been removed, annealing is performed at 1700° C. for about 30 minutes, for example, in an inert gas atmosphere. In this manner, the implanted impurity ions are activated, thereby obtaining source regions 4a and 4b.

Figure 5:
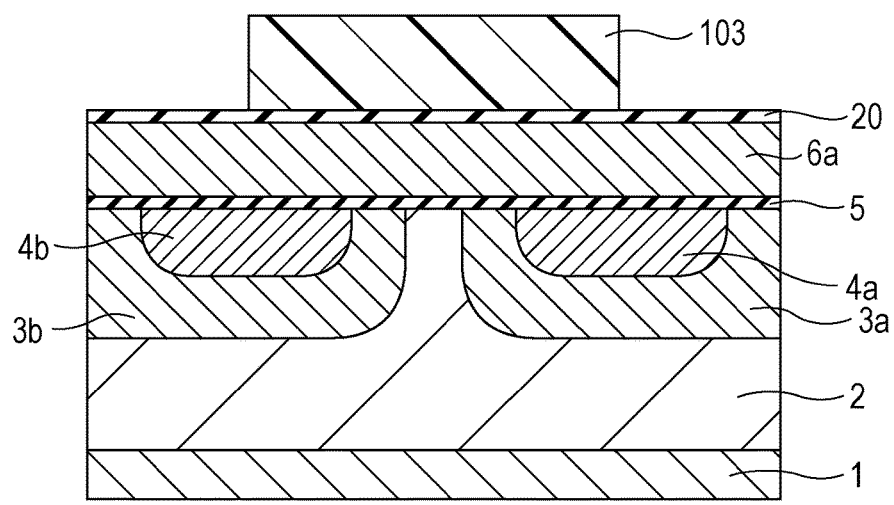
FIG. 5 is a cross-sectional view schematically showing the method for fabricating a semiconductor device of the embodiment.

Subsequently, as illustrated in FIG. 5, a gate insulating layer 5 is formed on the surface of the semiconductor layer 30. The thickness of the gate insulating layer 5 is, for example, greater than or equal to 30 nm and less than or equal to 100 nm. Here, a heat treatment is performed at 1200° C. for 3 hours in dry oxidizing atmosphere, for example, so that a surface region of the semiconductor layer 30 is oxidized, thereby forming a thermal oxidation layer with a thickness of, for example, 70 nm as the gate insulating layer 5. Thereafter, a conductive layer 6a is formed on the surface of the gate insulating layer 5. As the conductive layer 6a, a polysilicon layer doped with an impurity is deposited over the gate insulating layer 5 by, for example, low-pressure chemical vapor deposition (LP-CVD). The thickness of the polysilicon layer is, for example, 500 nm. Then, an insulating mask layer 20 is formed. As the insulating mask layer 20, a silicon oxidized layer is deposited over the conductive layer 6a by, for example, plasma-enhanced chemical vapor deposition (PE-CVD). The thickness of the silicon oxidized layer is, for example, 100 nm. Subsequently, a resist 103 is formed on the insulating mask layer 20 by lithography.

Figure 6:
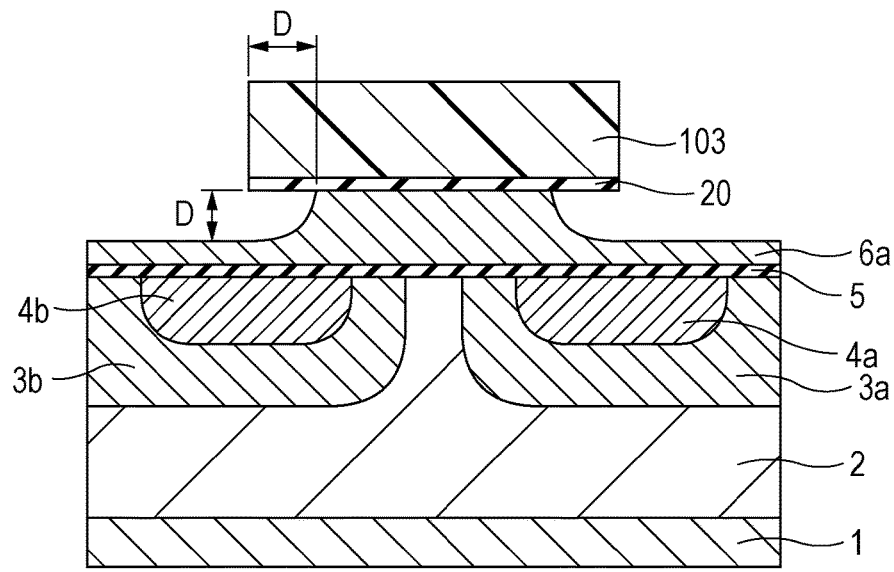
FIG. 6 is a cross-sectional view schematically showing the method for fabricating a semiconductor device of the embodiment.

Then, as illustrated in FIG. 6, the insulating mask layer 20 is etched using the resist 103 as a mask. Here, anisotropic dry etching using, for example, a CHF$_3$ gas is performed. Instead of the anisotropic dry etching, isotropic dry etching using, for example, a CF$_4$ gas or wet etching using, for example, a hydrogen fluoride aqueous solution may be performed. The anisotropic etching enables dimensions of the resist 103 to be accurately transferred onto the insulating mask layer 20. Thereafter, the conductive layer 6a is etched by isotropic etching using the insulating mask layer 20 as a mask. Here, as the isotropic etching, wet etching using, for example, a mixed solution of hydrogen fluoride and nitric acid is used. These isotropic etching steps may be performed after removal of the resist 103. However, if the resist 103 remains, etching of the insulating mask layer 20 can be prevented in isotropic etching and anisotropic etching, which will be described below. The depth D of isotropic etching is smaller than the thickness of the conductive layer 6a. When the isotropic etching depth D of the conductive layer 6a exceeds the thickness of the conductive layer 6a, the conductive layer 6a in a region not covered with the insulating mask layer 20 is completely removed. In this case, variations in the deposition thickness and etching rate of the conductive layer 6a cause the size of the gate electrode 6, i.e., the width Lg in FIG. 2, to vary. If the size of the gate electrode 6 is excessively decreases, the body regions 3a and 3b are not covered with the gate electrode 6 at the surface of the semiconductor layer 30 anymore, resulting in the possibility of a failure in transistor operation of the semiconductor device.

In the direction perpendicular to the thickness direction of the conductive layer, the depth D of the isotropic etching may be controlled to be smaller than a size of a region where the source region 4a or 4b and the insulating mask layer 20 overlap each other. In this manner, as described above, the gate electrode 6 positioned above regions serving as channels for the body regions 3a and 3b has a sufficient thickness.

Figure 7:
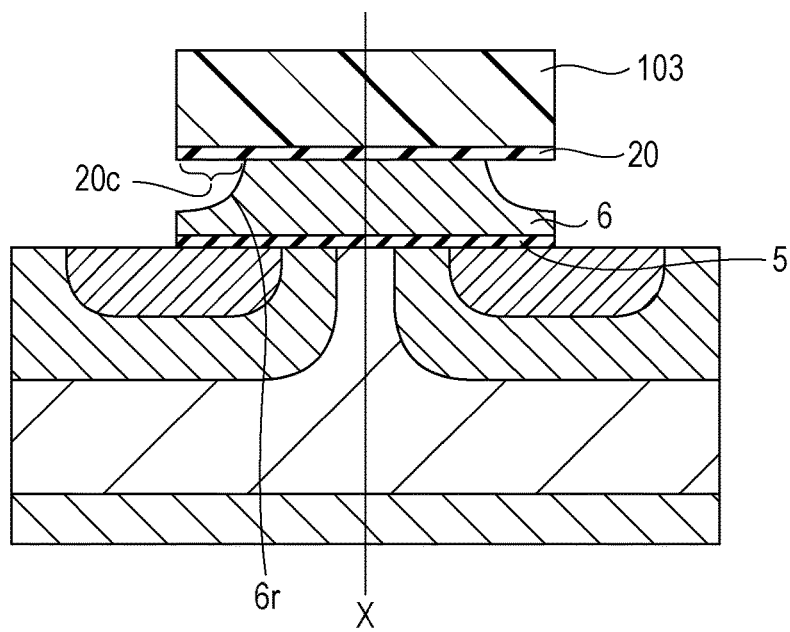
FIG. 7 is a cross-sectional view schematically showing the method for fabricating a semiconductor device of the embodiment.

Then, as illustrated in FIG. 7, the remaining conductive layer 6a is removed by anisotropic etching using the resist 103 and the insulating mask layer 20 as masks, thereby forming a gate electrode 6. Here, the anisotropic etching is performed using a mixed gas of chlorine, HBr, and oxygen. As described above, the anisotropic etching may be performed using only the insulating mask layer 20 as a mask after removal of the resist 103. Since the remaining conductive layer 6a is removed by anisotropic etching using the insulating mask layer 20 as a mask, the distance between an edge of the insulating mask layer 20 and the virtual center axis X of the gate electrode is equal to the distance between an edge of the gate electrode and the virtual center axis X of the gate electrode. Through this process step, a recess 6r is formed in an edge of an upper portion, i.e., a corner, of the gate electrode 6. The insulating mask layer 20 has a canopy 20c projecting over the recess 6r.

Figure 8:
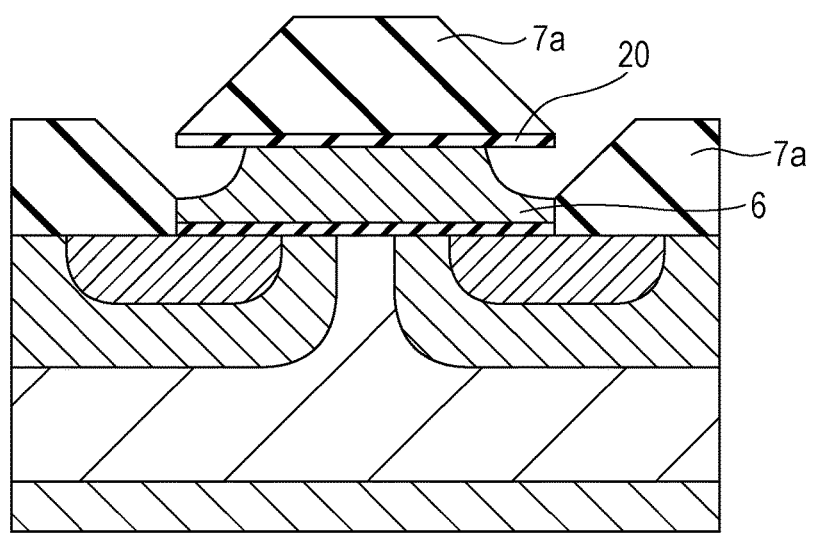
FIG. 8 is a cross-sectional view schematically showing the method for fabricating a semiconductor device of the embodiment.

Thereafter, as illustrated in FIG. 8, the resist 103 is removed, and then, a silicon oxidized layer, for example, is deposited by high density plasma chemical vapor deposition (HDP-CVD) to a thickness of 700 nm as a first interlayer insulating layer 7a. The HDP-CVD is CVD using high-density plasma. The plasma density in the HDP-CVD is higher than that of typical high-frequency plasma CVD. Thus, advantages such as formation of a high-quality layer at low temperatures can be obtained. In addition, since sputter etching and deposition are performed at the same time, deposition hardly occurs in a portion where the underlying layer is tilted more than about 45 degrees, and an edge of the deposited layer is tilted at a tilt angle of about 45 degrees. Furthermore, the degree of anisotropy is high, the interlayer insulating layer 7a is not deposited over the recess 6r of the gate electrode 6 positioned below the canopy 20c of the insulating mask layer 20. In addition, the use of HDP-CVD allows the silicon oxidized layer to contain fluorine. The silicon oxidized layer containing fluorine is allowed to have a small dielectric constant of 3.7. Thus, the use of the fluorine-containing silicon oxidized layer as the first interlayer insulating layer 7a can further reduce parasitic capacitances of the gate electrode.

Figure 9:
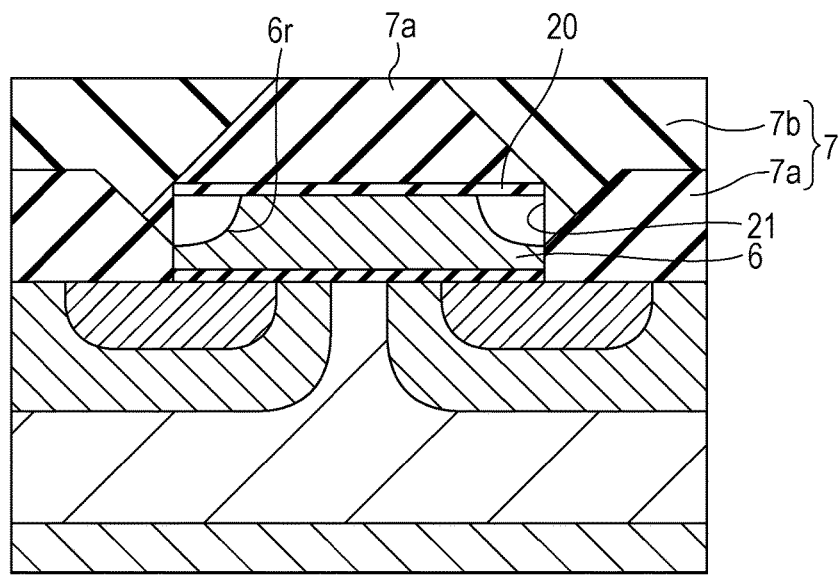
FIG. 9 is a cross-sectional view schematically showing the method for fabricating a semiconductor device of the embodiment.

Then, as illustrated in FIG. 9, a silicon oxidized layer, for example, is deposited by physical vapor deposition (PVD) to a thickness of 400 nm as a second interlayer insulating layer 7b. The first interlayer insulating layer 7a and the second interlayer insulating layer 7b will be collectively referred to as an interlayer insulating layer 7. Since PVD has a strong anisotropy, the second interlayer insulating layer 7b is not deposited over the recess 6r of the gate electrode 6 positioned below the canopy 20c of the insulating mask layer 20. Unlike HDP-CVD, since the edge of the deposited layer is not tilted, it is possible to fill a gap formed by HDP-CVD, except for the recess 6r of the gate electrode 6. In this manner, a cavity 21 is formed in a region surrounded by the insulating mask layer 20 and the gate electrode 6. The interlayer insulating layer 7 can be formed only of the second interlayer insulating layer 7b formed by PVD, without formation of the first interlayer insulating layer 7a by HDP-CVD. However, it is generally difficult for PVD to increase the deposition speed of an insulating layer. Thus, the interlayer insulating layer 7 is formed in two stages using a combination of PVD and HDP-CVD showing a high deposition speed. Then, productivity can be enhanced.

Thereafter, the surface of the interlayer insulating layer 7 is planarized by, for example, chemical mechanical polishing (CMP).

Figure 10:
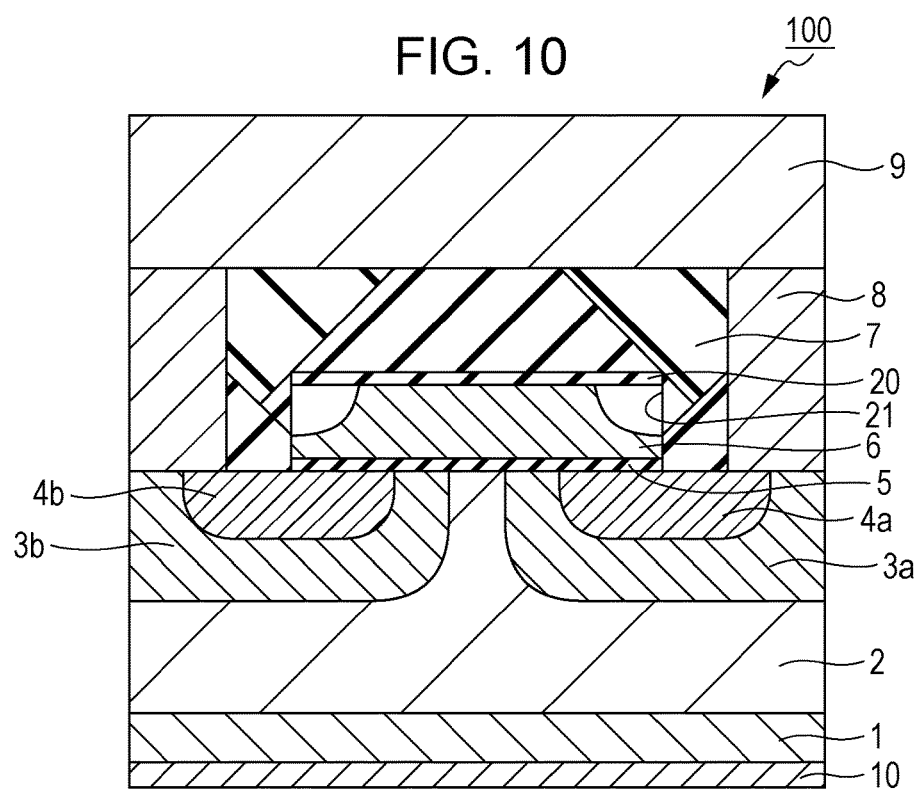
FIG. 10 is a cross-sectional view schematically showing the method for fabricating a semiconductor device of the embodiment.

Subsequently, as illustrated in FIG. 10, a contact hole connected to the source regions 4a and 4b and the body regions 3a and 3b are formed, and then, a conductive layer is formed, thereby forming source electrodes 8. A wiring 9 is formed to connect the source electrodes 8. A drain electrode 10 is formed on the back surface of the semiconductor substrate 1, thereby forming a unit cell 100 of the semiconductor device.

In the fabrication method described above, the recess 6r is formed in the edge of the upper portion, in the corner, of the gate electrode 6. In the recess 6r of the gate electrode 6, the cavity 21 surrounded by the gate electrode 6, the insulating mask layer 20, and the interlayer insulating layer 7 is formed. Since the cavity 21 has a small dielectric constant, the electrical thickness thereof is smaller than that of the interlayer insulating layer 7. Thus, the capacitance between the gate electrode 6 and the source electrodes 8 and the capacitance between the gate electrode 6 and the wiring 9 can be reduced.

The cavity 21 can be formed by adding the step of forming the insulating mask layer 20 and the step of edging the conductive layer 6a to a typical method for fabricating a semiconductor device and changing a technique of forming an interlayer insulating layer 7 of the typical method. Thus, an increase in the number of process steps can be reduced.

In addition, introduction of fluorine to the silicon oxidized layer deposited by HDP-CVD can reduce the dielectric constant of the silicon oxidized layer. Thus, the capacitance between the gate electrode 6 and the source electrodes 8 and the capacitance between the gate electrode 6 and the wiring 9 can be further reduced.

Figure 11:
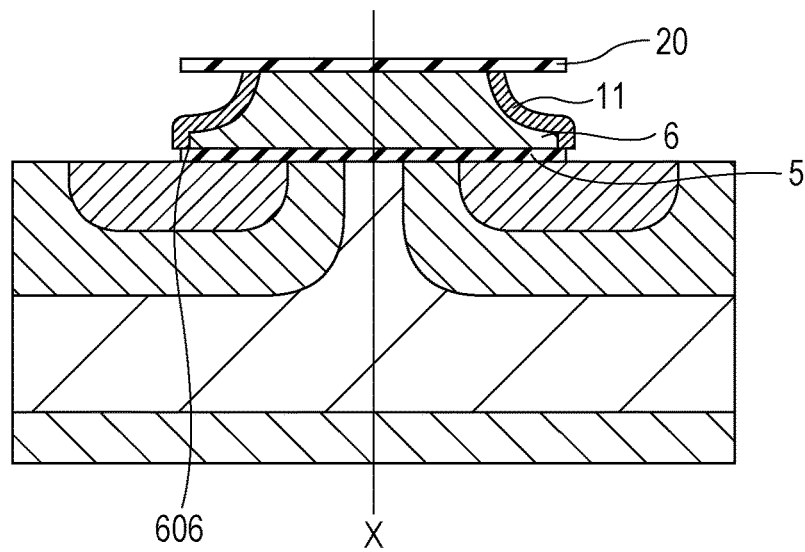
FIG. 11 is a cross-sectional view schematically showing a method for fabricating a semiconductor device according to a variation of the embodiment.

As illustrated in FIG. 11, the surface of the gate electrode 6 and part of the inside of the gate electrode 6 may be oxidized by removing the resist 103 after formation of the gate electrode 6 and performing heat treatment on the gate electrode 6 in an oxygen atmosphere. In this manner, a gate electrode oxide film 11 is formed on the surface of the gate electrode 6. With anisotropic etching, damage caused on the gate insulating film 5 during the formation of the gate electrode 6 might cause leakage of current. This damage can be recovered by performing heat treatment on the gate electrode 6 in the oxygen atmosphere. As illustrated in FIG. 11, since the surface of the gate electrode 6 and part of the inside of the gate electrode 6 is oxidized so that the distance between the edge of the insulating mask layer 20 and the virtual center axis X of the gate electrode is larger than the distance between the edge of the gate electrode and the virtual center axis X of the gate electrode.

Figure 12:
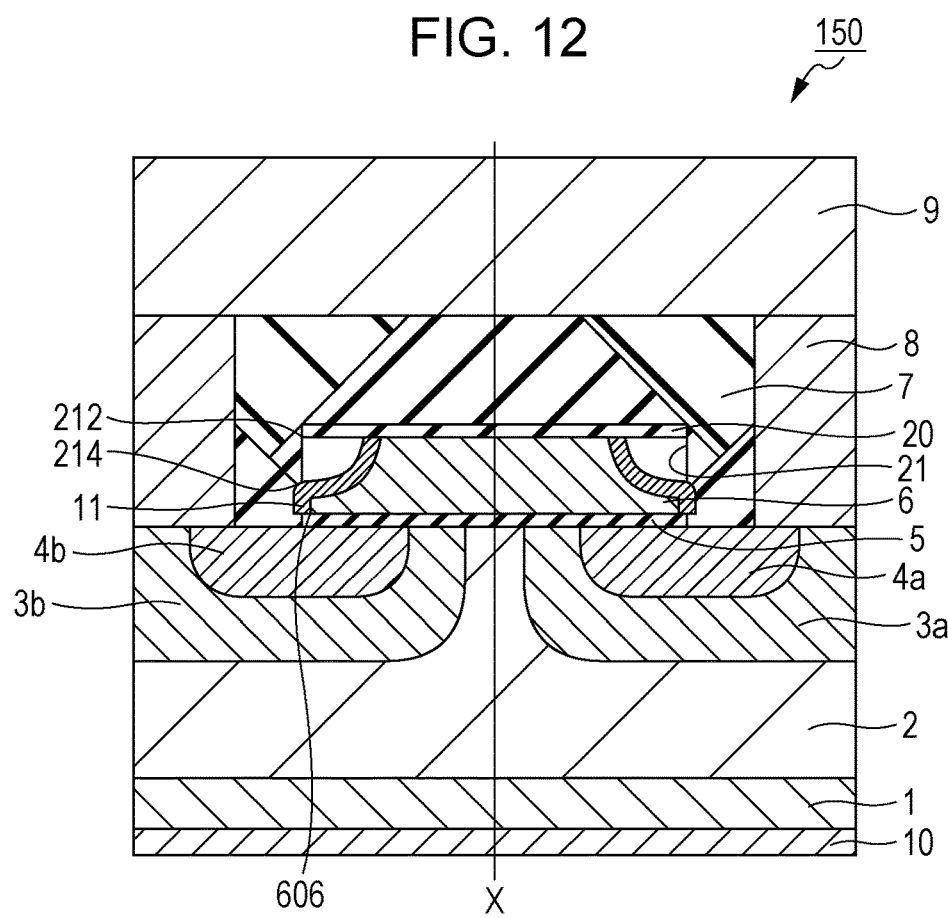
FIG. 12 is a cross-sectional view schematically illustrating a semiconductor device according to the variation of the embodiment.

Thereafter, the process steps described with reference to FIGS. 8 to 10 are performed, thereby obtaining a unit cell 150 of the semiconductor device illustrated in FIG. 12. As illustrated in FIG. 12, unlike the unit cell 100 illustrated in FIG. 1A, in the unit cell 150, the distance between the edge 212 or the edge 214 of the cavity 21 in contact with part of the interlayer insulating layer 7 between the cavity 21 and the source electrodes 8 and the virtual center axis X of the gate electrode 6 is larger than the distance between the edge 606 of the gate electrode 6 at the first surface 602 of the gate electrode 6 and the virtual center axis X of the gate electrode 6.

Figure 13:
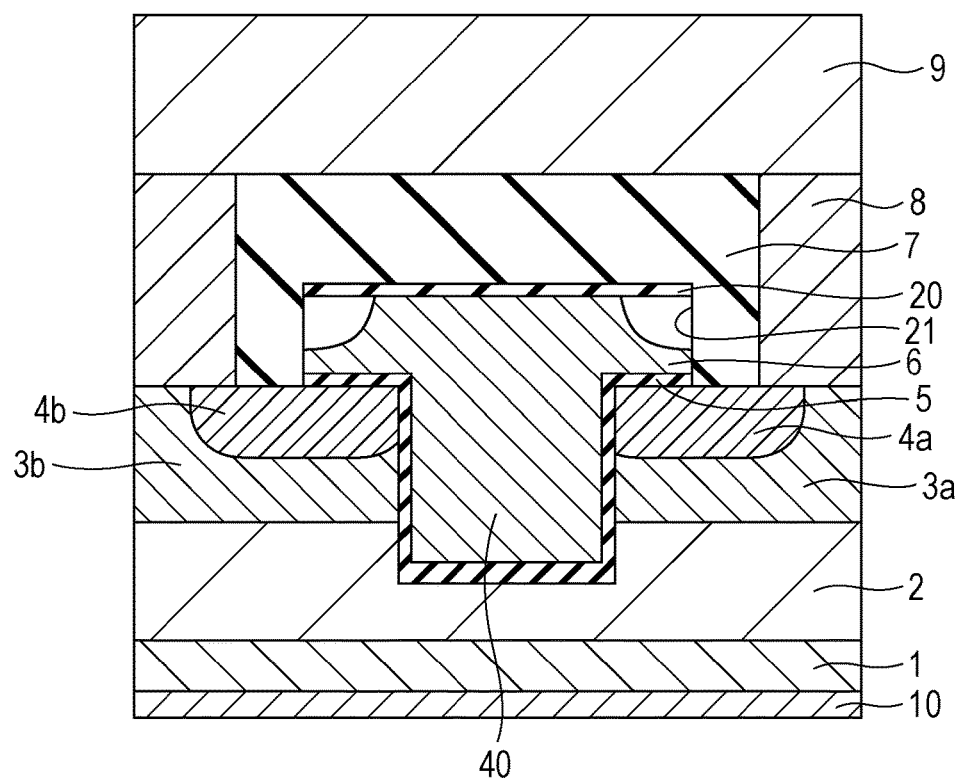
FIG. 13 is a cross-sectional view schematically illustrating a semiconductor device according to another variation of the embodiment.

In this embodiment, the unit cell 100 of the semiconductor device in which the transistor region has a planar structure has been described. Alternatively, a unit cell 200 of a trench-type semiconductor device as illustrated in FIG. 13 may be used. The trench-type semiconductor device includes a gate electrode having a trench 40. The unit cell 200 of the trench-type semiconductor device can also be fabricated with process steps similar to those for the unit cell 100 of the planar-type semiconductor device.

The method for fabricating a semiconductor device according to the present disclosure is not limited to the method described above. For example, a conductive material except polysilicon may be used as a material for the gate electrode 6, and an insulating material except the silicon oxidized layer may be used as a material for the interlayer insulating layer 7.

In the method described above, the cavity is formed by wet etching the conductive layer 6a. However, the present disclosure is not limited to this method, and the conductive layer 6a may be isotropically dry etched. For example, the conductive layer 6a can be isotropically etched by, for example, chemical dry etching (CDE). In this process step, $CF_4$, for example, may be used as an etching gas, and inductively coupled plasma (ICP) etching apparatus, for example, may be used as etching apparatus.

In the method described above, the 4H—SiC substrate is used as the substrate 1. Alternatively, another crystal plane or a SiC substrate of another polytype may be used. In the case of using a 4H—SiC substrate, the semiconductor layer 30 may be formed on the Si plane with the drain electrode 10 being formed on the C plane, or the semiconductor layer 30 may be formed on the C plane with the drain electrode 10 being formed on the Si plane.

In the method described above, the SiC substrate is used as the substrate 1. However, similar advantages can be obtained for semiconductor devices using other semiconductors except SiC, e.g., wide-bandgap semiconductors such as GaN, AlN, and diamond and Si semiconductor.

In the example of the foregoing description, the semiconductor device is an n-channel MISFET. Alternatively, the semiconductor device of the present disclosure may be, for example, a p-channel MISFET. In the p-channel MISFET, the conductivity type of the SiC substrate 1, the drift region 2, and the source regions 4a and 4b is a p type, and the conductivity type of the body regions 3a and 3b is an n type.

In the example of the foregoing description, the semiconductor device is a vertical MISFET, but may be a lateral MISFET. The semiconductor device is not limited to a power device and may be other devices such as a CMOS device.

The configuration of the semiconductor device of the present disclosure is no limited to those illustrated in FIGS. 1A, 12, and 13. For example, in the semiconductor device illustrated in FIGS. 1A, 12, and 13, the semiconductor layer 30 includes the body regions 3a and 3b, the source regions 4a and 4b, and the drift region 2. The semiconductor layer may further include other components. For example, a silicon carbide layer of a second conductivity type connecting the source region 4a and the source region 4b may be disposed between the surface of the semiconductor layer 30 and the gate insulating layer 5.

The semiconductor device of the present disclosure is widely applicable to semiconductor devices including gate electrodes, such as MISFETs, and various control devices and driving devices including the semiconductor devices. For example, the semiconductor device of the present disclosure can be used as a semiconductor device using a wide-bandgap semiconductor such as silicon carbide.

What is claimed is:

1. A semiconductor device comprising:
   a semiconductor layer having an impurity region of a first conductivity type;
   a gate insulating layer, at least a part of the gate insulating layer positioned on the semiconductor layer;
   a gate electrode positioned on the gate insulating layer and having a first surface in contact with the part of the gate insulating film and a second surface opposite to the first surface;
   an interlayer insulating layer covering the gate electrode;
   an electrode in contact with the impurity region; and
   a wiring positioned on the interlayer insulating layer and electrically connected to the electrode, wherein
   a part of the interlayer insulating layer is positioned between the gate electrode and the electrode,
   the gate electrode has a recess positioned at a corner in contact with the second surface of the gate electrode, in a cross section of the gate electrode perpendicular to a surface of the semiconductor layer,
   a cavity surrounded by the gate electrode and the interlayer insulating layer including the part of the interlayer insulating layer is positioned in a region including at least a part of the recess, a surface of the gate electrode defining the recess directly borders the cavity, and
   in the cross section of the gate electrode, a distance between an edge of the cavity in contact with the part of the interlayer insulating layer and a virtual center axis of the gate electrode is larger than or equal to a distance between an edge of the gate electrode at the first surface of the gate electrode and the virtual center axis of the gate electrode.

2. The semiconductor device of claim 1, further comprising an insulating mask layer positioned on the gate electrode.

3. The semiconductor device of claim 1, wherein the cavity is not in contact with the gate insulating layer.

4. The semiconductor device of claim 1, wherein
   the semiconductor layer further includes:
   a drift region of the first conductivity type, and
   a body region of a second conductivity type positioned above the drift region, and
   the impurity region is in contact with the body region.

5. The semiconductor device of claim 1, wherein in the cross section of the gate electrode, a length of a region where the gate electrode overlaps the impurity region is larger than a width of the cavity parallel to the surface of the semiconductor layer.

* * * * *